(12) United States Patent
Yatsu et al.

(10) Patent No.: US 6,829,277 B2
(45) Date of Patent: Dec. 7, 2004

US006829277B2

(54) DISTRIBUTED FEEDBACK SEMICONDUCTOR LASER DEVICE AND LASER MODULE

(75) Inventors: Ryosuke Yatsu, Tokyo (JP); Masaki Funabashi, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/195,104

(22) Filed: Jul. 15, 2002

(65) Prior Publication Data

US 2003/0039285 A1 Feb. 27, 2003

(30) Foreign Application Priority Data

Aug. 14, 2001 (JP) .......................................... 2001-246112
Jan. 29, 2002 (JP) .......................................... 2002-020507

(51) Int. Cl.[7] .............................. H01S 5/00; H01S 3/08
(52) U.S. Cl. ............................ 372/49; 372/50; 372/102
(58) Field of Search ............................... 372/49, 50, 102

(56) References Cited

U.S. PATENT DOCUMENTS

| 4,794,618 | A | * | 12/1988 | Mito ............................. 372/96 |
|---|---|---|---|---|
| 4,815,089 | A | * | 3/1989 | Miyauchi et al. ............. 372/49 |
| 4,984,243 | A | * | 1/1991 | Kagawa et al. ............... 372/46 |
| 5,020,072 | A | * | 5/1991 | Abe et al. ...................... 372/96 |
| 5,111,475 | A | * | 5/1992 | Ackerman et al. ............. 372/96 |
| 5,247,382 | A | * | 9/1993 | Suzuki .......................... 398/201 |
| 5,343,486 | A | * | 8/1994 | Itaya et al. .................... 372/43 |
| 5,469,459 | A | * | 11/1995 | Okuda et al. .................. 372/46 |
| 5,568,505 | A | * | 10/1996 | Okuda et al. .................. 372/96 |
| 5,617,436 | A | * | 4/1997 | Lo ................................. 372/45 |
| 5,621,747 | A | * | 4/1997 | Kitoh et al. ................... 372/45 |
| 5,802,096 | A | * | 9/1998 | Okuda ......................... 372/102 |
| 5,841,799 | A | * | 11/1998 | Hiroki .......................... 372/19 |
| 5,852,625 | A | * | 12/1998 | Takahashi .................... 372/96 |
| 5,901,168 | A | * | 5/1999 | Baillargeon et al. ......... 372/96 |
| 6,330,256 | B1 | * | 12/2001 | Byren et al. .................. 372/21 |
| 6,487,227 | B1 | * | 11/2002 | Kuramachi ................... 372/49 |
| 6,493,369 | B2 | * | 12/2002 | Funabashi et al. ........... 372/49 |
| 6,501,777 | B1 | * | 12/2002 | Sato .............................. 372/45 |
| 6,526,087 | B1 | * | 2/2003 | Okuda .......................... 372/96 |
| 6,529,537 | B2 | * | 3/2003 | Yamanaka .................... 372/49 |
| 6,625,190 | B1 | * | 9/2003 | Hayakawa et al. ........... 372/45 |
| 6,628,689 | B2 | * | 9/2003 | Okada et al. ................. 372/49 |
| 6,647,046 | B1 | * | 11/2003 | Salvatore ..................... 372/49 |

FOREIGN PATENT DOCUMENTS

JP            61-156894        7/1986

* cited by examiner

*Primary Examiner*—Don Wong
*Assistant Examiner*—Phillip Nguyen
(74) *Attorney, Agent, or Firm*—Oblon, Spivak, McClelland, Maier & Neustadt, P.C.

(57) ABSTRACT

Disclosed is a distributed feedback semiconductor laser device having a resonator for oscillating a laser beam and a laser module which is provided with the semiconductor laser device. The semiconductor laser device comprises a diffraction grating, formed inside the resonator, for periodically changing only an extinction coefficient k or both a real refractive index n and the extinction coefficient k in a complex refractive index N expressed by $N = n - ik$ where i is an imaginary unit. The resonator has a first facet having a first reflectance and a second facet opposite to the first facet and having a second reflectance. The first reflectance is smaller than the second reflectance and equal to or larger than 10%, preferably equal to or smaller than 20%.

7 Claims, 4 Drawing Sheets

DISTRIBUTED FEEDBACK SEMICONDUCTOR LASER DEVICE AND LASER MODULE

BACKGROUND OF THE INVENTION

1. Field of the Invention

The present invention relates to a distributed feedback semiconductor laser device and a laser module, and more particularly, to a gain coupling type or complex coupling type distributed feedback semiconductor laser device and a laser module which is provided with the distributed feedback semiconductor laser device.

2. Description of the Art

A distributed feedback semiconductor laser device (hereinafter referred to as "DFB laser device") is designed in such a way that a diffraction grating for periodically changing the real refractive index (real part) or the extinction coefficient (imaginary part) of a complex refractive index is formed inside a resonator which has a predetermined lamination structure of semiconductor materials and a predetermined resonator length to provide such a wavelength selectivity as to allow feedback to be applied only to a laser beam of a specific wavelength.

The complex refractive index N is generally expressed by $$N = n - ik$$

where n is the real refractive index, k is the extinction coefficient, and i is an imaginary unit.

Such DFB laser devices are generally classified into three groups depending on the type of the diffraction grating. The groups are (1) a refractive index coupling type which has such a structure that only the real refractive index (real part) n of the complex refractive index N changes periodically, (2) a gain coupling type which has such a structure that only the extinction coefficient (imaginary part) k of the complex refractive index N changes periodically, resulting in a periodic change only in gain, and (3) a complex coupling type which has such a structure that both the real refractive index n and the extinction coefficient k change periodically.

Such DFB laser devices are used widely in optical communication applications, and demanded of an existence of one longitudinal mode laser light with maximum gain (hereinafter referred to as "a high single-mode yield") and a high slope efficiency as well as a high resistance to slight reflected return lights from outside.

The conventional DFB laser devices, however, do not have a sufficient resistance to the reflected return lights from outside. In a trunk line system, which requires a stable operation, therefore, an optical isolator needs to be incorporated in a DFB laser module in which a DFB laser device is installed. In a subscriber's line system, it is also essential to incorporate an optical isolator in a DFB laser module in case where the DFB laser module is for a fast usage.

However, the DFB laser module that is used in a subscriber's line system strongly requires a low cost. Therefore, in the case where a DFB laser module, which is used for at least a relatively low speed usage, required is one which usage need not incorporate an optical isolator.

In case of manufacturing such a DFB laser module that does not have a built-in optical isolator, it is very important that as little external reflected and returned light as possible be allowed to enter the DFB laser device. To reduce the reflected and returned light, therefore, normally AR (Anti-Reflection) coating is applied to the surface of the lens that optically couples the DFB laser device to the optical fiber, or the facet of the optical fiber is subjected to skew polishing and AR coating is applied to the polished facet.

To increase the optical output of a DFB laser device itself and achieve a stable single-mode oscillation to thereby acquire a high single-mode yield, normally, AR coating is applied to that facet of the DFB laser device from which a laser beam is output (hereinafter this output facet is called "front facet" or "first facet" while the facet opposite to the front facet is called "rear facet" or "second facet"). The AR coating applied to the front facet, however, reduces the resistance to slight reflected and returned light, which brings about an unstable operation.

In other words, reducing the reflectance of the front facet of a DFB laser device lowers the resistance to slight reflected and returned light while improving the single-mode yield and the slope efficiency (the differential efficiency of the current vs. optical output characteristic in an oscillation state). Increasing the reflectance of the front facet, on the other hand, reduces the single-mode yield and slope efficiency while increasing the resistance to slight reflected and returned light. Apparently, the resistance to slight reflected and returned light has a trade-off relation with the single-mode yield and the slope efficiency, making it difficult to achieve both at the same time.

SUMMARY OF THE INVENTION

Accordingly, it is an object of the present invention to provide a DFB laser device and a laser module, which can stably operate in a single mode oscillation over a wide temperature range without using an optical isolator.

A distributed feedback semiconductor laser device according to the present invention, which has a resonator for oscillating a laser beam, comprises a diffraction grating, formed inside the resonator, for periodically changing only an extinction coefficient k (gain coupling type) or both a real refractive index n and the extinction coefficient k (complex coupling type) in a complex refractive index N (expressed by $N = n - ik$ where i is an imaginary unit), the resonator having a front facet having a first reflectance; and a rear facet opposite to the front facet and having a second reflectance, the first reflectance being smaller than the second reflectance and equal to or larger than 10%, preferably equal to or smaller than 20%.

According to the gain coupling type or complex coupling type distributed feedback semiconductor laser device of the present invention, as the reflectance of the front facet is made lower than the reflectance of the rear facet and set equal to or larger than 10%, it is possible to realize a stable single-mode operation over a wide temperature range and ensure a high single-mode yield and a high slope efficiency as well as a high resistance to slight reflected return lights.

A laser module according to the present invention comprises a distributed feedback semiconductor laser device having a resonator for oscillating a laser beam, the semiconductor laser device comprising a diffraction grating, formed inside the resonator, for periodically changing only an extinction coefficient k or both a real refractive index n and the extinction coefficient k in a complex refractive index N expressed by $N = n - ik$ where i is an imaginary unit, the resonator having a front facet having a first reflectance and a rear facet opposite to the front facet and having a second reflectance, the first reflectance being smaller than the second reflectance and equal to or larger than 10%, preferably equal to or smaller than 20%; an optical fiber which has a fiber facet and transfers a laser beam emitted by the semiconductor laser device; and a lens for optically coupling the semiconductor laser device to the optical fiber to cause the laser beam emitted by the semiconductor laser device to enter the fiber facet.

As the DFB laser device according to the present invention is installed in the laser module, it makes it unnecessary to incorporate an optical isolator and it is possible to provide a low-cost laser module which is used in, for example, a subscriber's line system.

According to a preferable mode of the distributed feedback semiconductor laser device of the present invention, a resonator for oscillating a laser beam comprises a first cladding layer, an active layer deposited on the first cladding layer, a second cladding layer deposited on the active layer and an electrode for injecting a current into the active layer via the second cladding layer.

The diffraction grating is preferably an absorption diffraction grating which is formed in the second cladding layer in a vicinity of the active layer and has a plurality of absorption portions arranged in a given periodicity.

It is also preferable that the diffraction grating be an active-layer etching diffraction grating and the active layer and the second cladding layer have projections and recesses alternately formed in a given periodicity at their interface so that the projections and recesses of the active layer respectively engage with the projections and recesses of the second cladding layer.

It is further preferable that the diffraction grating be a current blocking diffraction grating which is formed in the second cladding layer in a vicinity of the active layer and has a plurality of current blocks arranged in a given periodicity to suppress the current injected into the active layer from the electrode.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION OF THE INVENTION

Embodiments of the invention will now be described with reference to the accompanying figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the invention herein described.

Generally, the refractive index coupling type DFB laser devices tend to oscillate at two mode-wavelengths. The reason for the phenomenon is that there is a small difference between threshold gains of two oscillation wavelengths adjacent to the Bragg wavelength in both sides. Accordingly, the conventional DFB laser devices hardly realize only a single mode oscillation. The conventional DFB laser device also has a problem that a background noise made by slight reflected return lights causes operations to become unstable.

Whereas, the gain coupling type DFB laser device has a large difference between threshold gains of two mode-wavelengths adjacent to the Bragg wavelength in both sides, the laser device, therefore, can be easily produced to ensure a high production yield of the single mode, and a relatively high resistance to reflected return lights. Further, the complex coupling type DFB laser device has such a characteristic that only a single mode oscillation can occur to be selected from the two mode-wavelengths adjacent to the Bragg wavelength in both sides.

The present inventors made intensive studies on the resistance to reflected return lights and the single-mode yield and the slope efficiency, which are in a trade-off relationship with each other. The inventors paid an attention to the fact that a refractive index coupling type DFB laser device has a low yield in a single mode oscillation and a low resistance to reflected return lights. In general, a gain coupling type or complex coupling type DFB laser device has a relatively high yield in a single mode oscillation and a relatively high resistance to reflected return lights. Directing the attention to this fact, the inventors conceived an idea of possibly solving the aforementioned problem by using the gain coupling type or complex coupling type DFB laser device.

The inventors conducted various experiments on the conditions of the reflectance at the front facet of the gain coupling type or complex coupling type DFB laser device that could satisfy both a high resistance to reflected return lights and a high single-mode yield and a high slope efficiency. Having studied the results of the experiments, the inventors have developed a DFB laser device and laser module which can overcome the conventional problem.

Some preferable embodiments of the present invention will be described below with reference to the accompanying drawings.

(First Embodiment)

Figure 1:
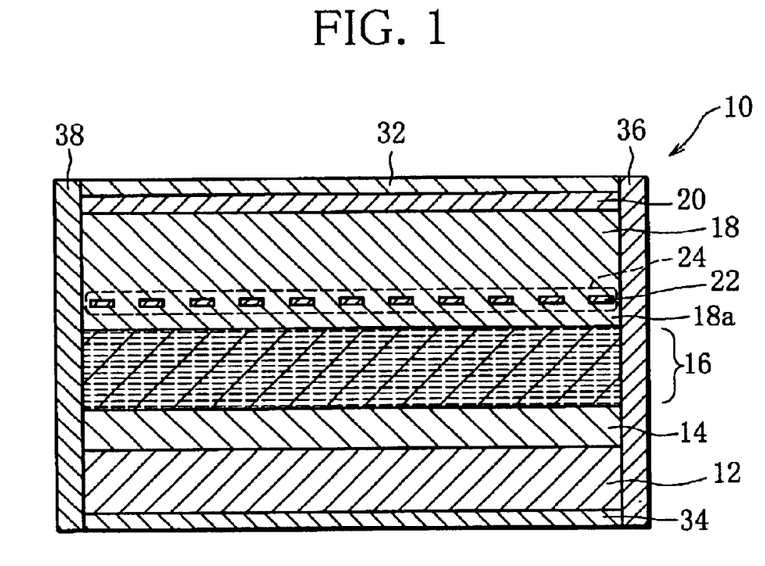
FIG. 1 is a schematic cross-sectional view showing a gain coupling DFB laser device of absorption diffraction grating type according to a first embodiment of the present invention.
Figure 2:
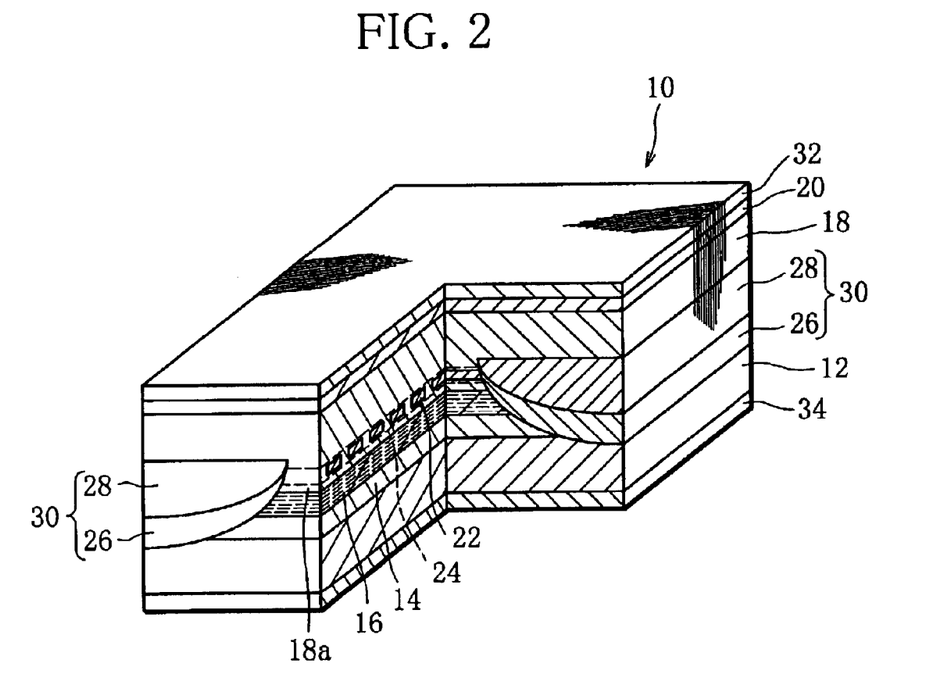
FIG. 2 is a partly cutaway perspective view of the DFB laser device in FIG. 1.

FIGS. 1 and 2 show a gain coupling DFB laser device 10 having an absorption diffraction grating according to the first embodiment of the present invention. The DFB laser device 10 has been developed as a laser device which has a target oscillation wavelength of about 1550 nm.

Specifically, the DFB laser device 10 has an n-InP substrate 12 on which an n-InP first cladding layer 14, an MQW-SCH (Multi-Quantum Well-Separate Confinement Heterostructure) active layer 16 having InGaAsP well layers and InGaAsP barrier layers alternately laminated one on the other, a p-InP second cladding layer 18 and a p-InGaAs contact layer 20 highly doped with an impurity are laminated in order.

An absorption diffraction grating 24 which has a plurality of InGaAs absorption portions 22 laid out in a given periodicity is formed in the p-InP second cladding layer 18 in the vicinity of the interface between the cladding layer 18 and the MQW-SCH active layer 16. The p-InP second cladding layer 18 that lies between the absorption diffraction grating 24 and the MQW-SCH active layer 16 is normally called a p-InP spacer layer 18a. An absorption diffraction grating structure is formed this way.

The semiconductor lamination area that includes the MQW-SCH active layer 16 and the absorption diffraction grating 24 is processed in a mesa stripe pattern extending in the longitudinal direction same as the direction of the propagation of laser light. Carrier block layers 30 each having a p-InP layer 26 and an n-InP layer 28 laminated in order are embedded in both sides of the mesa stripe, thereby providing an embedded heterostructure.

A Ti/Pt/Au upper electrode 32 is formed on the surface of the p-InGaAs contact layer 20, while an AuGeNi lower electrode 34 is formed on the surface of the n-InP substrate 12.

The lamination structure that are comprised of those various kinds of semiconductor materials has a front facet at the cleaved face, on which a reflection film 36 having a reflectance of 10 to 20% is coated. A high reflection film 38 having a higher reflectance than the reflectance of the reflection film 36 is coated on the other rear facet. Such coating on the front and rear facets characterizes the present embodiment.

If the reflectance of the reflection film 36 is less than 10%, the resistance to reflected return lights drops, making it difficult to secure the stable operation over a wide temperature range of, for example, −40° C. to 85° C. In case where the absorption diffraction grating type gain coupling DFB laser device is installed in a DFB laser module, therefore, an optical isolator should be incorporated as needed in a prior art to be discussed later, so that the object of the present invention cannot be achieved. If the reflectance of the reflection film 36 exceeds 20%, the optical output drops and stable single-mode oscillation is deteriorated, thus lowering the single-mode yield. In this case, the object of the present invention cannot be achieved either.

The desired reflectance within the range of 10 to 20% is acquired by using, for example, a $SiN_x$ film for the reflection film 36 and the high reflection film 38 and changing the composition or thickness of the film. The cleaved face (reflectance of 31%) may be used as it is instead of coating the high reflection film 38.

According to the conventional DFB laser devices, AR coating is applied to the front facet while the rear facet is a high reflectance facet. While it is possible to effectively provide high optical output from the front facet, external lights are easily coupled to the internal electric field so that the conventional DFB laser devices are susceptible to reflection noise. As a solution to the problem of the conventional DFB laser devices, a DFB laser device disclosed in Japanese Unexamined Patent Publication No. 61-156894 has been proposed. According to the conventional DFB laser device, it is proposed to set the reflectance of the front facet equal to or larger than 10% and make the reflectance of the rear facet higher than the reflectance of the cleaved face. It is mentioned that this design can increase the resistance to the reflection noise to thereby improve the high temperature operation characteristic.

As apparent from the description, however, the DFB laser device disclosed in Japanese Unexamined Patent Publication No. 61-156894 is a refractive index coupling type DFB laser device. The advantage remains at such an extent that the use of an ordinary optical isolator of about 30 dB can permit the conventional DFB laser device to be used without generating large noise with respect to reflected return lights. That is, in case of using this conventional DFB laser device, an optical isolator needs to be used still.

Therefore, the DFB laser device taught in the prior art publication cannot be said to achieve the aim of the present invention of realizing a DFB laser module incorporating no optical isolator by increasing the resistance to reflected return lights to such a level as to eliminate the need for an optical isolator.

According to the publication 61-156894, if the relationship between the gain peak wavelength and the DFB oscillation wavelength in the DFB laser device disclosed in the publication lies within the proper range, the reflectance (31%) of the cleaved face as-is is sufficient to provide a high output and the Fabry-Perot mode can be suppressed. The prior art publication also suggests that oscillation in a single longitudinal mode can be maintained by optimizing the coupling coefficient and the detuning amount (the difference between the gain peak wavelength of the active layer and the DFB oscillation wavelength) of the DFB laser device. According to the additional experiments conducted by the present inventors, however, it was not possible to realize the stable operation over a wide temperature range of, for example, −40° C. to 85° C. This is because in case of a refractive index coupling type DFB laser device, a temperature-dependent change in gain peak wavelength differs from that in DFB oscillation wavelength, which makes it difficult to ensure fine tuning over a wide temperature range. This seems to be the reason why the stable operation cannot be realized over a wide temperature range even if the reflectance of the front facet is set equal to or greater than 10%.

It should reluctantly be said that the DFB laser device disclosed in Japanese Unexamined Patent Publication No. 61-156894 can not meet the demand on a DFB laser device which is used in the subscriber's line system or the demand of ensuring a stable single-mode operation over a wide temperature range of −40° C. to 85° C.

Figure 3:
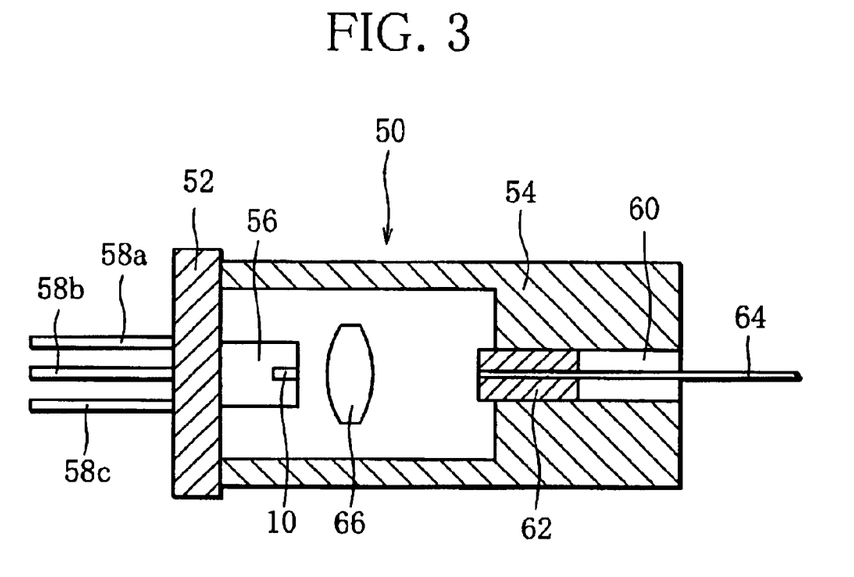
FIG. 3 is a schematic cross-sectional view showing a coaxial DFB laser module in which a gain coupling DFB laser device of absorption diffraction grating type in FIGS. 1 and 2 is installed.

Referring now to FIG. 3, a description will be given of a coaxial DFB laser module in which the gain coupling DFB laser device shown in FIGS. 1 and 2 is installed.

As shown in FIG. 3, a DFB laser module 50 has a cap 54 with an approximately cylindrical shape attaching to and covering one side surface of a stem 52. The absorption diffraction grating type DFB laser device 10 according to the present embodiment is bonded onto the stem 52 in the cap 54 via a pedestal 56. A plurality of lead pins 58a, 58b and 58c electrically connected to the DFB laser device 10 protrude from the other side surface of the stem 52 in the direction opposite to the cap 54.

A circular window 60 is provided in the head of the cap 54 and a columnar ferrule 62 is fitted in the window 60. An optical fiber 64 is inserted into the center through hole of the ferrule 62.

A lens 66 supported by a holder (not shown) is placed in the cap 54. The DFB laser device 10 is optically coupled via the lens 66 to the optical fiber 64 inserted in the ferrule 62. That is, a laser beam emitted from the device 10 is condensed by the lens 66 and enters the optical fiber 64.

According to the DFB laser device 10 of the present embodiment, as mentioned above, the reflection film 36 with a reflectance of 10 to 20% is coated on the front facet. The reflection film 36 makes the single-mode yield higher than that provided in a case where a refractive index coupling type DFB laser device is used, thereby increasing the resistance to reflected return lights, and also ensures the stable single-mode operation over a wide temperature range of, for example, −40° C. to 85° C.

This makes it possible to achieve both high resistance to reflected return lights and high single-mode yield and high slope efficiency.

According to the DFB laser module 50 with such a DFB laser device 10 installed therein, the action and advantage of the gain coupling DFB laser device 10 incorporating the absorption diffraction grating can eliminate the need to incorporate an optical isolator. It is therefore possible to provide a low-cost DFB laser module equipped with no optical isolator, which is used in the subscriber's line system.

(Second Embodiment)

An example of a gain coupling DFB laser device having a diffraction grating structure obtained by active-layer etching method incorporated therein according to the second embodiment of the present invention will be described with reference to FIG. 4.

A DFB laser device 10A according to the second embodiment uses a gain diffraction grating structure obtained by active-layer etching method in place of the absorption diffraction grating structure of the DFB laser device 10 according to the first embodiment. The same constituting elements as those of the DFB laser device 10 shown in FIG. 1 of the first embodiment are affixed with the same reference numbers. Therefore, the explanation for them will not be repeated.

Figure 4:
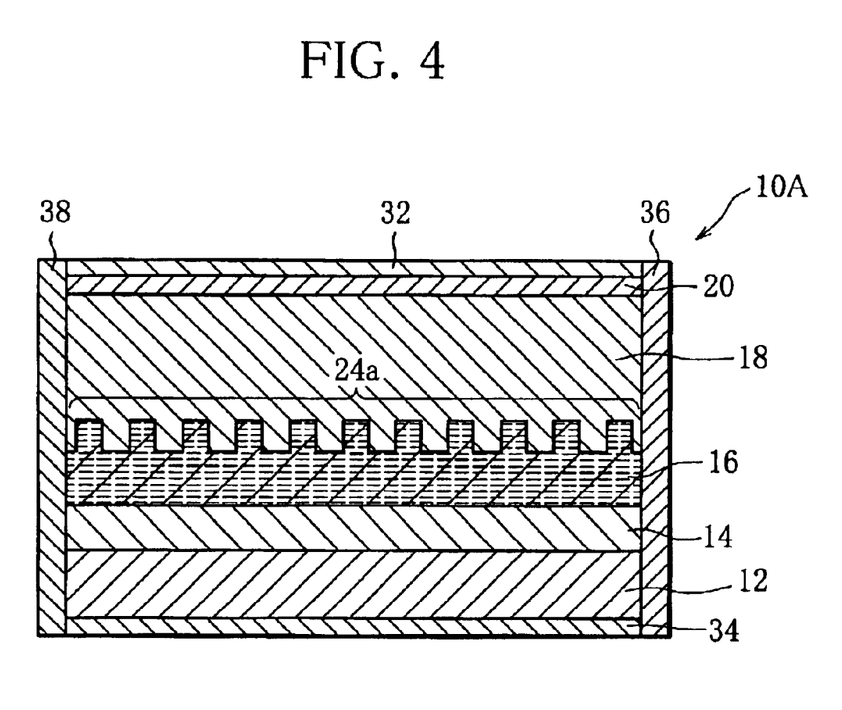
FIG. 4 is a schematic cross-sectional view showing a gain coupling DFB laser device of gain diffraction grating type, which is obtained by active layer etching method, according to a second embodiment of the present invention.

As shown in FIG. 4, the DFB laser device 10A has an n-InP substrate 12 on which an n-InP first cladding layer 14, an MQW-SCH active layer 16 having InGaAsP well layers and InGaAsP barrier layers alternately laminated one on the other, a p-InP second cladding layer 18 and a p-InGaAs contact layer 20 are laminated in order.

The MQW-SCH active layer 16 is so processed by etching as to have a pattern of projections and recesses in a given periodicity at the interface between the MQW-SCH active layer 16 and the p-InP cladding layer 18, so that a gain diffraction grating 24a is formed with the same material of the MQW-SCH active layer 16 and the specific pattern. In this manner the gain diffraction grating structure is obtained by active-layer etching method.

The semiconductor lamination area that includes the diffraction grating 24a is processed in a mesa stripe pattern extending in the longitudinal direction. Carrier block layers each having a p-InP layer and an n-InP layer laminated in order are embedded in both sides of the mesa stripe, thereby providing an embedded heterostructure. A Ti/Pt/Au upper electrode 32 is formed on the surface of the p-InGaAs contact layer 20 and an AuGeNi lower electrode 34 is formed on the surface of the n-InP substrate 12.

A reflection film 36 having a reflectance of 10 to 20% is coated on the first facet at the cleaved face of the lamination structure as a resonator that are comprised of those various kinds of semiconductor materials. A high reflection film 38 having a higher reflectance than the reflectance of the reflection film 36 is coated on the other second facet. Those coatings are like as those of the first embodiment.

A coaxial DFB laser module which has the DFB laser device 10A in FIG. 4 installed therein is equivalent to one provided by replacing the DFB laser device 10 according to the first embodiment in FIG. 3 that incorporates an absorption diffraction grating with the DFB laser device 10A that incorporates an active-layer etching diffraction grating. Because the other constituting elements are the same as those of the DFB laser module of the first embodiment, their illustration and description will not be repeated.

According to the DFB laser device 10A of the second embodiment, as mentioned above, the reflection film 36 with a reflectance of 10 to 20% is coated on the front facet. This makes it possible to provide approximately the same advantage as that of the first embodiment and to achieve both a high resistance to reflected return lights and a high single-mode yield and high slope efficiency.

According to the DFB laser module that has the DFB laser device 10A installed therein, the action and advantage of the DFB laser device 10A can provide a low-cost DFB laser module equipped with no optical isolator, which is used in, for example, the subscriber's line system, nearly as per the first embodiment.

(Third Embodiment)

An example of a gain coupling DFB laser device having a current blocking diffraction grating incorporated therein according to the third embodiment of the present invention will be discussed with reference to FIG. 5.

A DFB laser device 10B according to the third embodiment uses a current blocking gain diffraction grating structure in place of the absorption diffraction grating structure of the DFB laser device 10 according to the first embodiment. The same constituting elements as those of the DFB laser device 10 shown in FIG. 1 of the first embodiment are affixed with the same reference numbers. Therefore, the explanation for them will not be repeated.

Figure 5:
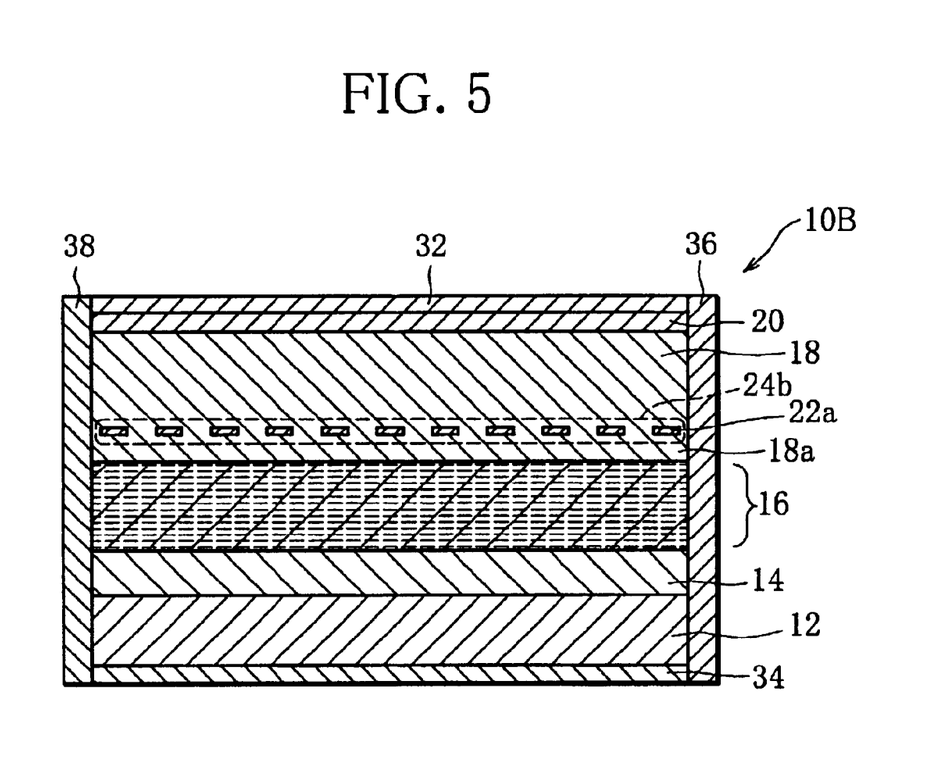
FIG. 5 is a schematic cross-sectional view showing a gain coupling DFB laser device of gain diffraction grating type, which has a current blocking structure, according to a third embodiment of the present invention.

According to the DFB laser device 10B [of the third embodiment], as shown in FIG. 5, a current blocking diffraction grating 24b which has n-InP current block portions 22a laid in a given periodicity is formed instead of the absorption diffraction grating 24 in the DFB laser device 10 shown in FIG. 1 which has the InGaAs absorption portions 22 laid in a given periodicity, thereby providing a current blocking gain diffraction grating structure.

Because the other constituting elements are the same as those of the DFB laser device 10 of the first embodiment, a further description of the structure of the gain coupling type DFB laser device 10B that incorporates the current blocking diffraction grating will be omitted.

A coaxial DFB laser module which has the DFB laser device 10B in FIG. 5 installed therein is equivalent to one provided by replacing the DFB laser device 10 according to the first embodiment in FIG. 3 with the DFB laser device 10B that incorporates a current blocking gain diffraction grating. Because the other constituting elements are the same as those of the DFB laser module of the first embodiment, their illustration and description will not be repeated.

According to the DFB laser device 10B of the third embodiment, as mentioned above, the reflection film 36 with a reflectance of 10 to 20% is coated on the first facet. This makes it possible to provide approximately the same advantage as that of the first embodiment and to achieve a high single-mode yield and a high slope efficiency as well as a high resistance to reflected return lights.

According to the DFB laser module that has the DFB laser device 10B installed therein, the DFB laser device 10B has approximately the same action and advantage as the first embodiment. This makes it possible to provide a low-cost DFB laser module equipped with no optical isolator, which is used in, for example, the subscriber system.

The description of the first embodiment has been given of the gain coupling type DFB laser device 10 that has the absorption diffraction grating 24 having a plurality of InGaAs absorption portions 22 periodically laid. The description of the second embodiment has been given of the gain coupling type DFB laser device 10A that has the active-layer etching gain diffraction grating 24a comprising the MQW-SCH active layer 16 which has a pattern of periodical projections and recesses. The foregoing description of the third embodiment has been given of the gain coupling DFB laser device 10B that has the current blocking diffraction grating 24b comprising a plurality of current blocking diffraction grating 24b laid periodically. The present invention is not however limited to those DFB laser devices, but may be adapted to gain coupling type DFB laser devices having other structures. The present invention is also adapted to a complex coupling type DFB laser device instead of the gain coupling type. The complex coupling type DFB laser device is disclosed in, for example, U.S. Pat. No. 4,716,570.

Although the MQW-SCH active layer 16 is disposed on the n-InP substrate 12, the active layer is not limited to the MQW-SCH structure but may take other various structures including, for example, a single-QW (Quantum Well) structure, GRIN (Graded Index) structure, distorted QW structure and a combination of those structures. Moreover, other various structures than such QW structures can be adopted.

The n-InP substrate 12 may be replaced with a p-InP substrate in which case the polarity of remaining semiconductor layers that are formed on the substrate should be reversed. Further, the DFB laser device may be a gain coupling type or complex coupling type DFB laser device which uses a GaAs substrate in place of the InP substrate and uses a GaAlAs system or an InGaP system for the active layer and which has a target oscillation wavelength of approximately 700 to 900 nm or approximately 660 to 690 nm.

Although a coaxial DFB laser module has been discussed in the foregoing descriptions of the first to third embodiments, the DFB laser module according to the present invention is not limited to a coaxial type but can demonstrate the same advantage even in case of using other module forms, such as a DIL (Dual Inline) type and a butterfly type.

EXAMPLES 1 TO 3

Examples 1 to 3 correspond to the first embodiment. That is, Examples 1 to 3 are of the gain coupling type DFB laser devices 10 in FIGS. 1 and 2 in each of which the absorption diffraction grating is embedded, and these were prepared while changing some factors. Using Examples 1 to 3, DFB laser modules were prepared as like as the DFB laser modules 50 having the DFB laser devices 10 installed therein, to measure the characteristics of obtained Examples 1 to 3.

First, by using, for example, an MOCVD (Metal Organic Chemical Vapor Deposition) apparatus, the n-InP first cladding layer 14 with a thickness of 500 nm was grown on the n-InP substrate 12 at a growth temperature of 600° C., InGaAsP well layers with a thickness of 5 nm and InGaAsP barrier layers with a thickness of 10 nm were alternately deposited on the n-InP first cladding layer 14, thereby forming the MQW-SCH active layer 16 with a thickness of 150 nm, and the p-InP spacer layer 18a with a thickness of 100 nm which constituted part of the p-InP second cladding layer 18 and an InGaAS absorption layer with a thickness of 20 nm were deposited to be grown on the MQW-SCH active layer 16 in order.

Next, a photoresist was coated on the InGaAS absorption layer to a thickness of about 100 nm, after which a resist diffraction grating pattern having a period of about 240 nm was formed by using an EB (Electron Beam) drawing apparatus. The duty ratio of the EB resist diffraction grating was set to about 0.5 (50%).

Then, with the resist diffraction grating as an etching mask, the InGaAS absorption layer was selectively etched. The etching process used a bromine-based etchant which had no etch selectivity between the InGaAS absorption layer and the p-InP spacer layer 18a and was carried out in such a way that the InGaAS absorption layer was etched through to etch the surface layer of the underlying p-InP spacer layer 18a by about 10 nm. In this manner the absorption diffraction grating 24 which had a plurality of InGaAs absorption portions 22 laid with a periodicity of about 240 nm. Note that the duty ratio of the absorption diffraction grating 24 formed set to 0.3 (30%).

Then, after the resist diffraction grating pattern was removed, a p-InP diffraction grating embedded-layer was grown on the p-InP spacer layer 18a and the InGaAs absorption portions 22 to embedded the projections and recesses of the absorption diffraction grating 24 for planarization of the surface thereof by using, for example, an MOCVD apparatus. The growth of the p-InP diffraction grating embedded-layer was carried out at a relatively low temperature of, for example, 520° C. in such a way that the shape of the absorption diffraction grating 24 was not distorted. As the p-InP diffraction grating embedded-layer constitutes part of the p-InP second cladding layer 18, it was included in the p-InP second cladding layer 18 in FIGS. 1 and 2.

Next, after an $SiN_x$ film was deposited on the entire surface of the substrate using, for example, a plasma CVD (Chemical Vapor Deposition) apparatus, the $SiN_x$ film was patterned into a stripe shape using photolithography technology and an RIE (Reactive Ion Etching) apparatus.

Subsequently, with the stripe-shaped $SiN_x$ film used as an etching mask, etching was carried out to reach the n-InP substrate 12 from the p-InP diffraction grating embedded-layer to pattern the semiconductor lamination area including the MQW-SCH active layer 16 and the absorption diffraction grating 24 in a mesa stripe shape. In the mesa stripe patterning, the width of the MQW-SCH active layer 16 was adjusted to about 1.5 $\mu$m. Then, with the $SiN_x$ film as a mask for selective growth, the p-InP layer 26 and the n-InP layer 28 were embedded in both sides of the mesa stripe, thereby forming the carrier block layers 30. This provided a embedded heterostructure.

Next, after removal of the $SiN_x$ film, the p-InP second cladding layer 18 with a thickness of about 2 $\mu$m and the p-InGaAs contact layer 20 with a thickness of 30 nm, highly doped with an impurity, were laminated to be grown in order on the entire surface of the substrate. Then, the bottom surface of the n-InP substrate 12 was polished to adjust the thickness to approximately 120 $\mu$m.

Next, the Ti/Pt/Au upper electrode 32 was formed on the surface of the p-InGaAs contact layer 20 and the AuGeNi lower electrode 34 was formed on the bottom surface of the n-InP substrate 12.

Next, the wafer-shaped substrate was cleaved in a predetermined direction to provide bars, after which the reflection film 36 formed by an $SiN_x$ film was coated on the front facet, one of the facets, of the cleaved surface, and the high reflection film 38 formed by an $SiN_x$ film having a higher reflectance than the reflectance of the reflection film 36 was coated on the other, rear facet by using, for example, a plasma CVD apparatus.

At this time, the composition or the thickness of the SiN$_x$ film was changed so that the reflectance of the reflection film 36 to be coated on the front facet became 1%, 5%, 10% and 20%. Specifically, the thickness of the SiN$_x$ film (refractive index n=1.97) was set to 200 nm when the reflectance of the reflection film 36 was 1%, for example, the thickness of the SiN$_x$ film (refractive index n=2.25) was set to 170 nm when the reflectance of the reflection film 36 was 5%, the thickness of the SiN$_x$ film (refractive index n=2.45) was set to 150 nm when the reflectance of the reflection film 36 was 10%, and the thickness of the SiN$_x$ film (refractive index n=2.90) was set to 130 nm when the reflectance of the reflection film 36 was 20% (Controls 1 and 2; Examples 1 and 2).

The front facet as cleaved, of the reflectance of 31% was employed to compare to the reflection film 36 coated front facet (Example 3).

Further, the high reflection film 38 on the other rear facet having a higher reflectance than the reflectance of the reflection film 36 or the reflectance of 31% in case of the cleaved front facet which was left uncoated. Thereafter, the resultant structure was divided into chips to prepare the absorption diffraction grating gain coupling type DFB laser device 10 and a DFB laser device having a similar structure.

Next, the DFB laser module 50 and the like shown in FIG. 3 were prepared by installing the absorption diffraction grating gain coupling type DFB laser device 10 and the like. As the manufacture method is known, its description will not be given.

Then, a check was made on the slope efficiency, the transmission waveform and the single-mode yield of each of the DFB laser module 50 and the like shown in FIG. 3 prepared by installing the DFB laser device 10 and the like.

Figure 6A:
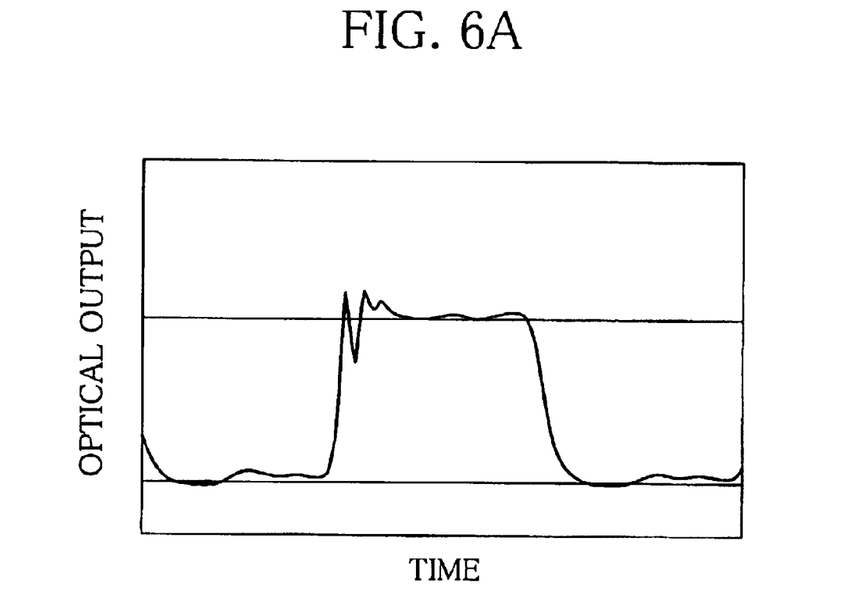
FIGS. 6A and 6B are diagrams illustrating eye patterns of transmission signals with respect to reflected return lights to check the transmission characteristic.
Figure 6B:
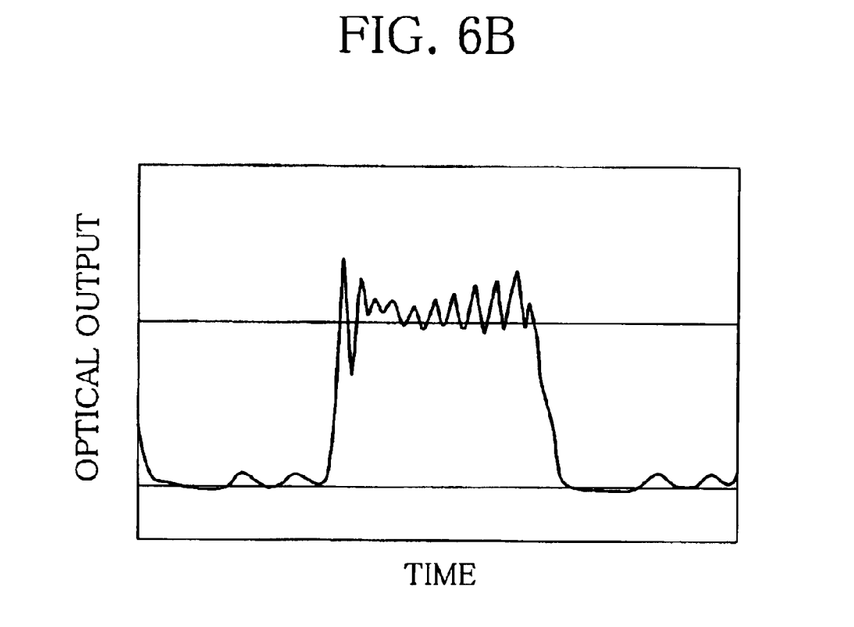

The determination on the quality of the transmission waveform was made by observing the eye patterns of the transmission signals in case where the reflected return lights to the DFB laser device 10 was set to −14 dB. The result of the decision was O (good) when the signal waveform was hardly degraded as apparent from FIG. 6A and X (defective) when the signal waveform had a significant degradation as apparent from FIG. 6B.

Table 1 below shows the results of measuring the characteristics.

TABLE 1

| | Reflectance of front facet (%) | Slope efficiency (W/A) | Quality of transmission waveform | Single-mode yield (%) |
|---|---|---|---|---|
| Control 1 | 1 | 0.45 | X | 95 |
| Control 2 | 5 | 0.44 | X | 93 |
| Example 1 | 10 | 0.43 | O | 91 |
| Example 2 | 20 | 0.40 | O | 92 |
| Example 3 | 31 | 0.30 | O | 90 |

EXAMPLES 4 TO 6

Examples 4 to 6 correspond to the second embodiment. That is, Examples 4 to 6 are of the gain coupling type DFB laser devices 10A in FIG. 4 in each of which the active-layer etching diffraction grating is embedded and these were prepared while changing some factors. Using Examples 4 to 6, DFB laser modules were prepared as like as the DFB laser modules having the DFB laser devices 10A installed therein, to measure the characteristics of obtained Examples 4 to 6.

First, the n-InP first cladding layer 14 and the MQW-SCH active layer 16 having InGaAsP well layers and InGaAsP barrier layers alternately deposited one on the other were formed on the n-InP substrate 12 under the same conditions of those of Examples 1 to 3.

Next, a photoresist was coated on the MQW-SCH active layer 16 to a thickness of about 100 nm, after which a resist diffraction grating pattern having a periodicity of about 240 nm was formed by using an EB (Electron Beam) drawing apparatus. The duty ratio of the EB resist diffraction grating was set to about 0.5 (50%).

Then, with the resist diffraction grating used as an etching mask, the MQW-SCH active layer 16 was selectively etched. The etching process formed a pattern of projections and recesses with a periodicity of about 240 nm on the surface of the MQW-SCH active layer 16, thereby forming by active-layer etching method, the gain diffraction grating 24a comprised of the MQW-SCH active layer 16 with the periodic projection and recess pattern.

Then, after the resist diffraction grating pattern was removed, a p-InP diffraction grating embedded-layer was grown on the MQW-SCH active layer 16 with the projections and recesses pattern on its surface by the same process as used in Examples 1 to 3, thereby embedding the projections and recesses of the gain diffraction grating 24a for planarization of the surface thereof. As the p-InP diffraction grating embedded layer constitutes part of the p-InP second cladding layer 18, it was included in the p-InP second cladding layer 18 in FIG. 4.

Then, by using the same process as involved in Examples 1 to 3, the semiconductor lamination area including the MQW-SCH active layer 16 and the gain diffraction grating 24a was patterned into a mesa stripe shape, after which a p-InP layer and n-InP layer were embedded in both sides of the mesa stripe, thereby forming a carrier block layer. This provides an embedded heterostructure. Further, the p-InP second cladding layer 18 and the p-InGaAs contact layer 20 were deposited to be grown on the entire substrate surface in order.

Subsequently, the Ti/Pt/Au upper electrode 32 was formed on the surface of the p-InGaAs contact layer 20 and the AuGeNi lower electrode 34 was formed on the bottom surface of the n-InP substrate 12 whose thickness was adjusted by polishing the back side of the n-InP substrate 12.

Next, the wafer-shaped substrate was cleaved in a predetermined direction to provide bars, after which the reflection film 36 was coated on the front facet, one of the facets, of the cleaved surface. At this time, the reflectance of the reflection film 36 to be coated on the front facet was set to 1%, 5%, 10% and 20% (Controls 3 and 4; Examples 4 and 5). Further, the cleaved front facet was left uncoated to set its reflectance to 31% instead of coating the reflection film 36 (Example 6).

Furthermore, the high reflection film 38 having a higher reflectance than the reflectance of the reflection film 36 or the reflectance of 31% in case of the cleaved front facet was coated on the other rear facet of the cleaved surface. Then, the resultant structure was divided into chips to prepare the gain coupling type DFB laser device 10A and a DFB laser device having a similar structure.

Next, DFB laser modules were prepared by installing DFB laser device 10A and the like. Then, a check was made on the slope efficiency, the transmission waveform and the single-mode yield of each of the DFB laser modules.

The method of the determination on the quality of the transmission waveform was the same as the one employed in the first embodiment.

Table 2 below shows the results of measuring the characteristics.

TABLE 2

|  | Reflectance of front facet (%) | Slope efficiency (W/A) | Quality of transmission waveform | Single-mode yield (%) |
|---|---|---|---|---|
| Control 3 | 1 | 0.36 | X | 97 |
| Control 4 | 5 | 0.36 | X | 93 |
| Example 4 | 10 | 0.32 | ◯ | 94 |
| Example 5 | 20 | 0.31 | ◯ | 90 |
| Example 6 | 31 | 0.25 | ◯ | 91 |

TABLE 3

|  | Reflectance of front facet (%) | Slope efficiency (W/A) | Quality of transmission waveform | Single-mode yield (%) |
|---|---|---|---|---|
| Control 5 | 1 | 0.47 | X | 85 |
| Control 6 | 5 | 0.45 | X | 80 |
| Example 7 | 10 | 0.44 | ◯ | 82 |
| Example 8 | 20 | 0.42 | ◯ | 81 |
| Example 9 | 31 | 0.32 | ◯ | 84 |

EXAMPLES 7 TO 9

Examples 7 to 9 correspond to the third embodiment. That is, Examples 7 to 9 are of the gain coupling type DFB laser devices 10B in FIG. 5 in each of which the current blocking diffraction grating is embedded. And using Examples 7 to 9, DFB laser modules were prepared as like as the DFB laser modules having the DFB laser devices 10B installed therein, to measure the characteristics of obtained Examples 7 to 9.

The steps of process for manufacturing Examples 7 to 9 were the same as those for manufacturing Examples 1 to 3 except that the step of forming the absorption diffraction grating 24 having a plurality of InGaAs absorption portions 22 laid with a periodicity of about 240 nm by selectively etching the InGaAs absorption layer deposited to be grown on the p-InP spacer layer 18a. The above forming step was replaced in Examples 7 to 9 with the step of forming the current blocking diffraction grating 24b having a plurality of n-InP current block portions 22a laid with a periodicity of about 240 nm by selectively etching the n-InP current block layer deposited on the p-InP spacer layer 18a.

Therefore, the description of the process from the formation of the n-InP first cladding layer 14 and the like on the n-InP substrate 12 to the formation of bars by cleaving the wafer-shaped substrate, in which a embedded heterostructure has been formed, in a predetermined direction will be omitted.

Next, the reflection film 36 was coated on the front facet, that is, one of the cleaved surfaces. At this time, the reflectance of the reflection film 36 to be coated on the front facet was set to 1%, 5%, 10% and 20% (for Controls 5 and 6; Examples 7 and 8). Further, the front facet for Example 9 was left uncoated to set its reflectance to 31% instead of coating the reflection film 36.

Furthermore, the high reflection film 38 was coated on the other rear facet of the cleaved surfaces. The film 38 had a higher reflectance than the reflectance of the reflection film 36 or the reflectance of 31% in case of the cleaved front facet left uncoated. Then, the resultant structure was divided into chips to prepare the DFB laser device 10B and a DFB laser device having a similar structure to the device 10B.

Next, a DFB laser module and the like were prepared by installing the gain coupling type DFB laser device 10B and the like. Then, measurements of characteristics were made on the slope efficiency, the transmission waveform and the single-mode yield of each of the DFB laser devices. The method of the determination on the quality of the transmission waveform was the same as the one employed in the first embodiment.

Table 3 below shows the results of measuring the characteristics.

The following are apparent from Tables 1 to 3.

(1) In the gain coupling type DFB laser devices 10, 10A and 10B, each of which the absorption diffraction grating, active-layer etching diffraction grating or current blocking diffraction grating is embedded respectively, the slope efficiency tends to become lower as the reflectance of the front facet increases. In case of the DFB laser devices 10 and 10B, each of which the absorption diffraction grating or current blocking diffraction grating is embedded, the order of 0.4 W/A in the slope efficiency is guaranteed in a reflectance range of 1 to 20% (Controls 1 and 2 and Examples 1 and 2; Controls 5 and 6 and Examples 7 and 8), whereas the order was drops to 0.3 W/A when the reflectance becomes 31% (Example 3; Example 9). In case of the gain coupling type DFB laser device 10A having the active-layer etching diffraction grating, the slope efficiency is slightly lower than those of the laser device 10 having the absorption diffraction grating or the laser device 10B having current blocking diffraction grating and the order of 0.3 W/A in the slope efficiency is secured in a reflectance range of 1 to 20% (Controls 3 and 4 and Examples 4 and 5), whereas the order drops to 0.2 W/A when the reflectance becomes 31% (Example 6).

(2) While the degradation of the transmission signal waveform caused by reflected return lights is observed over the 1 to 5% range of the reflectance of the front facet (Controls 1 and 2; Controls 3 and 4; Controls 5 and 6), the degradation is hardly observable when the reflectance becomes 10% or higher, ensuring excellent transmission characteristics (Examples 1 to 3; Examples 4 to 6; Examples 7 to 9).

(3) The single-mode yield tends to slightly drop as the reflectance of the front facet increases. In case of the laser device 10 having the absorption diffraction grating and the laser device 10A having the active-layer etching diffraction grating, a high single-mode yield of 90% or higher is acquired in any of the cases (Controls 1 and 2 and Examples 1 to 3; Controls 3 and 4 and Examples 4 to 6). In case of the laser device 10B having current blocking diffraction grating, while the single-mode yield is slightly lower than those of the DFB laser devices 10 and 10A, the single-mode yield is 80% or higher in any of the cases (Controls 5 and 6 and Examples 7 to 9).

The results above proves that the reflectance of the front facet of the gain coupling type DFB laser device 10 having the absorption diffraction grating should lie in a range of 10 to 20% (Examples 1 and 2) from the viewpoint of satisfying a high resistance to reflected return lights as well as a high slope efficiency and high single-mode yield.

Then, an operational test was conducted over a wide temperature range of −40° C. to 85° C. on every type of the DFB laser devices 10, 10A and 10B, which had front facet reflectances of 10% and 20%. Specifically, the transmission waveform and the optical spectrum were measured at individual temperatures of −40° C., −20° C., 25° C., 75° C. and 85° C. The measuring results showed excellent single-mode transmission waveforms at any of the temperatures.

Conventional refractive index coupling type DFB laser devices having similar structures to that of the DFB laser device 10 having the absorption diffraction grating [gain coupling type DFB laser device 10] were prepared and their slope efficiencies, transmission waveforms and single-mode yields were checked in case where the reflectance of the front facet was set to 1%, 5%, 10%, 20% and 31% (Controls 7 to 11). The results are shown in Table 4 below.

TABLE 4

|  | Reflectance of front facet (%) | Slope efficiency (W/A) | Quality of transmission waveform | Single-mode yield (%) |
| --- | --- | --- | --- | --- |
| Control 7 | 1 | 0.47 | X | 72 |
| Control 8 | 5 | 0.46 | X | 68 |
| Control 9 | 10 | 0.44 | X | 53 |
| Control 10 | 20 | 0.40 | ○ | 35 |
| Control 11 | 31 | 0.35 | ○ | 27 |

Comparing the results on Table 4 with the results on Tables 1 to 3, it is apparent that the single-mode yield of each of the Controls of Table 4 drops significantly. This proves that setting the reflectance of the front facet lower than the reflectance of the rear facet and 10% or higher cannot lead to the effect of archiving a high slope efficiency and high single-mode yield unless such a design is adapted to a gain coupling type DFB laser device (or a complex coupling type DFB laser device) and the same effect should not necessarily be expected by applying the design to a refractive index coupling type DFB laser device.

What is claimed is:

1. A distributed feedback semiconductor laser device comprising:
    a resonator for oscillating a laser beam, said resonator formed from a stack of semiconductor layers, said resonator including
    a first facet of said stack having a first reflectance, said first facet including a reflection film with a reflective equal to or larger than 10%;
    a second facet of said stack on an opposite side of said stack relative to said first facet and having a second reflectance; and
    a diffraction grating, formed inside said resonator, for periodically changing only an extinction coefficient k or both a real refractive index n and said extinction coefficient k in a complex refractive index N expressed by N =n−ik where i is an imaginary unit; and
    said first reflectance being smaller than said second reflectance.

2. The distributed feedback semiconductor laser device according to claim 1, wherein said first reflectance is equal to or smaller than 20%.

3. A distributed feedback semiconductor laser device comprising:
    a resonator for oscillating a laser beam, which comprises a first cladding layer, an active layer positioned on said first cladding layer, a second cladding layer positioned on said active layer, and an electrode positioned over said second cladding layer for injecting a current into said active layer via said second, cladding layer; and
    a first facet of said resonator, having a relection film having a reflectance equal to or larger than 10%;
    a second facet of said resonator opposite to said first facet and having a second reflectance; and
    a diffraction grating, formed on interface between said active layer and said second cladding layer or between said active layer and said second cladding layer in a vicinity of said active layer, for periodically changing only an extinction coefficient k or both a real refractive index n and said extinction coefficient k in a complex refractive index N expressed by N=n−ik where i is an imaginary unit; and
    said first reflectance being smaller than said second reflectance.

4. The distributed feedback semiconductor laser device according to claim 3, wherein said first reflectance is equal to or smaller than 20%.

5. The distributed feedback semiconductor laser device according to claim 3 or 4, wherein said diffraction grating is an absorption diffraction grating which is formed in said second cladding layer in a vicinity of said active layer and has a plurality of absorption portions arranged in a given periodicity.

6. The distributed feedback semiconductor laser device according to claim 3 or 4, wherein said diffraction grating is etched within said active-layer and said active layer and said second cladding layer have projections and recesses alternatively formed in a given periodicity at their interface so that said projections and recesses of said active layer respectively engage with said projections and recesses of said second cladding layer.

7. The distributed feedback semiconductor laser device according to claim 3 or 4, wherein said diffraction grating is a current blocking diffraction grating which is formed in said second cladding layer in a vicinity of said active layer and has a plurality of current block portions arranged in a given periodicity in order to depress current injected into said active layer from said electrode.

* * * * *